United States Patent
Liao et al.

(10) Patent No.: US 6,554,625 B1
(45) Date of Patent: Apr. 29, 2003

(54) PICK UP DEVICE USED FOR AND AN ELECTRICAL SOCKET

(75) Inventors: Fang-Chu Liao, Tu-Chen (TW); Nick Lin, Tu-Chen (TW); Hsiang-Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/126,219

(22) Filed: Apr. 18, 2002

(30) Foreign Application Priority Data

Dec. 26, 2001 (TW) .................................. 90222984 U

(51) Int. Cl.⁷ ............................................. H01R 13/44
(52) U.S. Cl. ...................................... 439/135; 439/940
(58) Field of Search .................................. 439/135, 148, 439/149, 150, 136, 940

(56) References Cited

U.S. PATENT DOCUMENTS

| | | | | |
|---|---|---|---|---|
| 5,147,209 A | * | 9/1992 | Litwin et al. | 439/70 |
| 6,135,795 A | * | 10/2000 | Ho et al. | 439/135 |
| 6,146,155 A | * | 11/2000 | Boling et al. | 439/79 |
| 6,155,848 A | * | 12/2000 | Lin | 439/135 |

\* cited by examiner

*Primary Examiner*—Hien Vu
(74) *Attorney, Agent, or Firm*—Wei Te Chung

(57) ABSTRACT

A socket assembly (10) includes a socket (1) and a pick up device (2) releasably mounted to the socket. The socket has a base (11) and a cover (12) slidably mounted on the base. The pick up device includes a cap (21) and a film member (22) adhered to the cap. The cap is releasably mounted to the cover of the socket and defines a pair of through slots (212). The film member is adhered to the top face (218) of the cap to cover the through slots for being manipulated by the vacuum suction device to position the CPU socket on a circuit board.

1 Claim, 8 Drawing Sheets

US 6,554,625 B1

PICK UP DEVICE USED FOR AND AN ELECTRICAL SOCKET

BACKGROUND OF THE INVENTION

1. Field of the Invention

The present invention relates to an electrical socket, and particularly to a pick up device for use with the socket in vacuum manipulation.

2. Description of Prior Art

Electronic components, such as CPU (Central Processing Unit) sockets, are often positioned on an underlying printed circuit board (PCB) by means of a vacuum suction device. Since the cover of the CPU socket has a plurality of through holes distributed in substantial an entire surface thereof, the vacuum suction device can not properly manipulate on the socket. Thus, alternative means is used with the vacuum suction device to properly position the CPU socket on the PCB.

Referring to FIG. 7, one feasible way is to provide a film 3 on a CPU socket 30 in positioning the CPU socket 30 on an underlying circuit board (not shown). The film 3 substantially covers the whole surface of a cover 4 of the CPU socket 30. A vacuum suction device (not shown) can then manipulate on a flat face 32 of the film 3 for positioning the CPU socket 30 on the circuit board. Since the CPU socket 30 often defines a large opening 34 in a center portion thereof, the film 3 must have a large thickness for supporting the vacuum suction force of the vacuum suction device for reliable manipulation thereon to attach the CPU socket to the circuit board, thereby manufactured cost of the film 3 is fairly high.

Referring to FIG. 8, another way is to provide a cap 5 mounted to a CPU socket 50 with vacuum force applied to the cap 5 for positioning the CPU socket 50 on an underlying circuit board (not shown). The cap 5, substantially shaped in a rectangular, covers a portion of a surface of a movable cover 6 of the CPU socket 50 and forms a pair of resilient beams (not shown) in a bottom face thereof for engaging with the movable cover 6. The cap 5 further defines a pair of through slots 51 corresponding to the resilient beams for inspection the engagement between the resilient beams of the cap 5 and the cover 6. The cap 5 provides only a limited area which is within an inscribed circle "A" defined by the through slots 51 for the vacuum suction device to manipulate. Therefore, care must be exercised in using a vacuum suction device to manipulate on the cap 5 within the inscribed circle "A", otherwise the vacuum suction device can not effectively pick up and position the CPU socket 50 on the underlying circuit board.

Hence, an improved pick up device for use with an electrical socket is required to overcome the above-mentioned disadvantages.

BRIEF SUMMARY OF THE INVENTION

A first object of the present invention is to provide a pick up device easily manipulated by a vacuum suction device for reliably positioning a CPU socket on a circuit board.

A second object of the present invention is to provide a low-cost pick up device which is used with a vacuum suction device for reliably positioning a CPU socket on a circuit board.

To fulfill the above-mentioned objects, a socket assembly in accordance with the present invention comprises a socket and a pick up device releasably mounted to the socket to be manipulated by a vacuum suction device for positioning the socket on a circuit board. The socket has a base and a cover slidably mounted on the base. The pick up device includes a cap and a film member adhered to a top face of the cap. The cap is mounted to the cover of the socket and defines a pair of through slots. The film member is an airtight tape or a thin film and fully covers the through slots of the cap for being manipulated by the vacuum suction device to properly position the socket on the circuit board.

Other objects, advantages and novel features of the invention will become more apparent from the following detailed description of the present embodiment when taken in conjunction with the accompanying drawings.

DETAILED DESCRIPTION OF THE INVENTION

Figure 1:
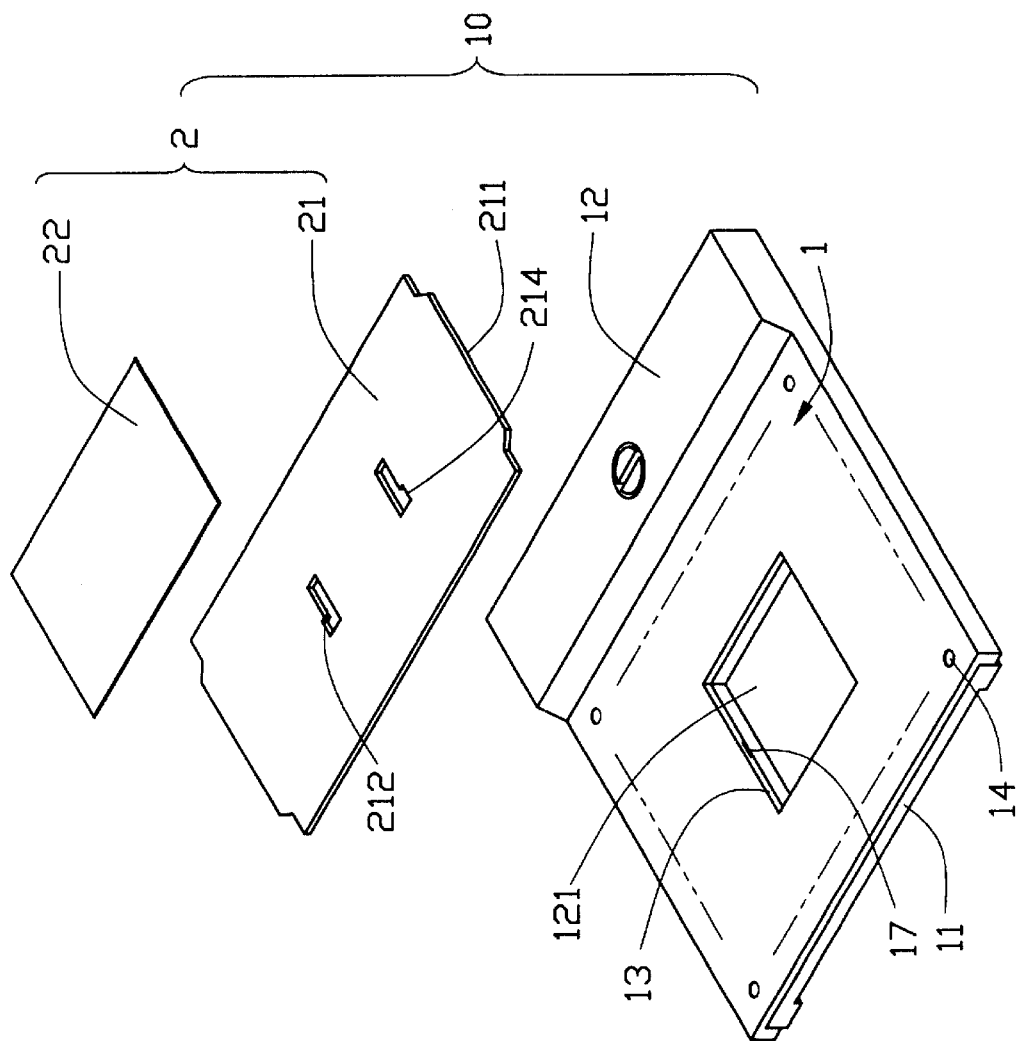
FIG. 1 is an exploded perspective view of an electrical socket assembly in accordance with the present invention.

Reference will be made to the drawings for detailed description of the present invention. Referring to FIG. 1, a CPU (Central Processing Unit) socket assembly 10 in accordance with the present invention includes a socket 1 and a pick up device 2 to be releasably mounted to the socket 1 in assembling the socket 1 with an underlying circuit board (not shown).

Figure 2:
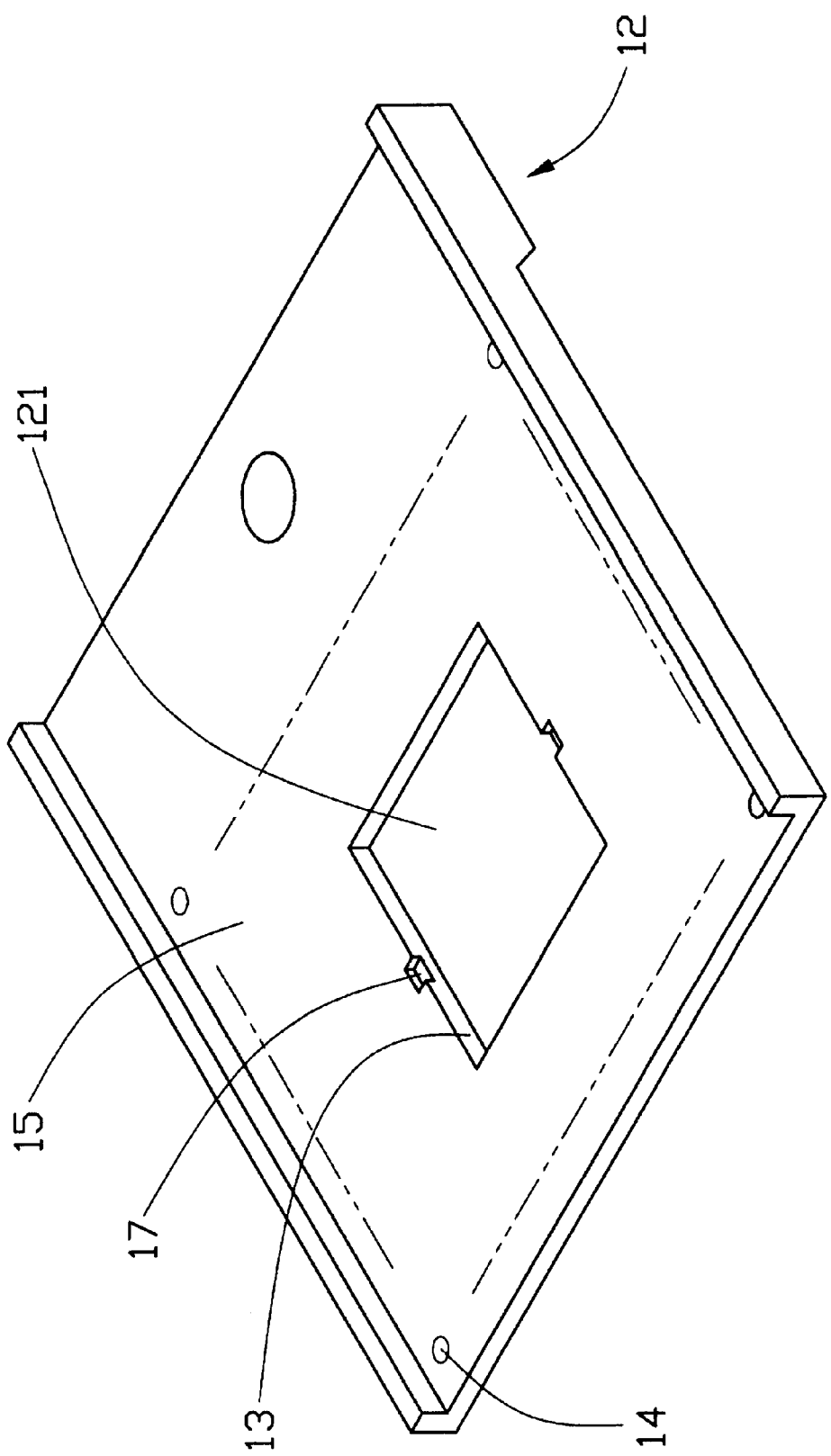
FIG. 2 is a bottom perspective view of a cover of the electrical socket assembly of FIG. 1.

The socket 1 has a non-conductive base 11 retaining a plurality of conductive contacts (not shown) for soldering to the circuit board, and a slidable cover 12 mounted on the base 11. Further referring to FIG. 2, a bottom perspective view of the slidable cover 12 is shown. The cover 12 forms a central rectangular opening 121 defined by inner side edges 13 of the cover 12. An array of pin holes 14 are defined in the base 11 around the central opening 121 for receiving of corresponding pins of a CPU (not shown) mounted to the socket 1. A bottom face 15 of the cover 12 defines a pair of cutouts 17 in opposite inner side edges 13 of the base 11 and communicating with the central opening 121.

Figure 3:
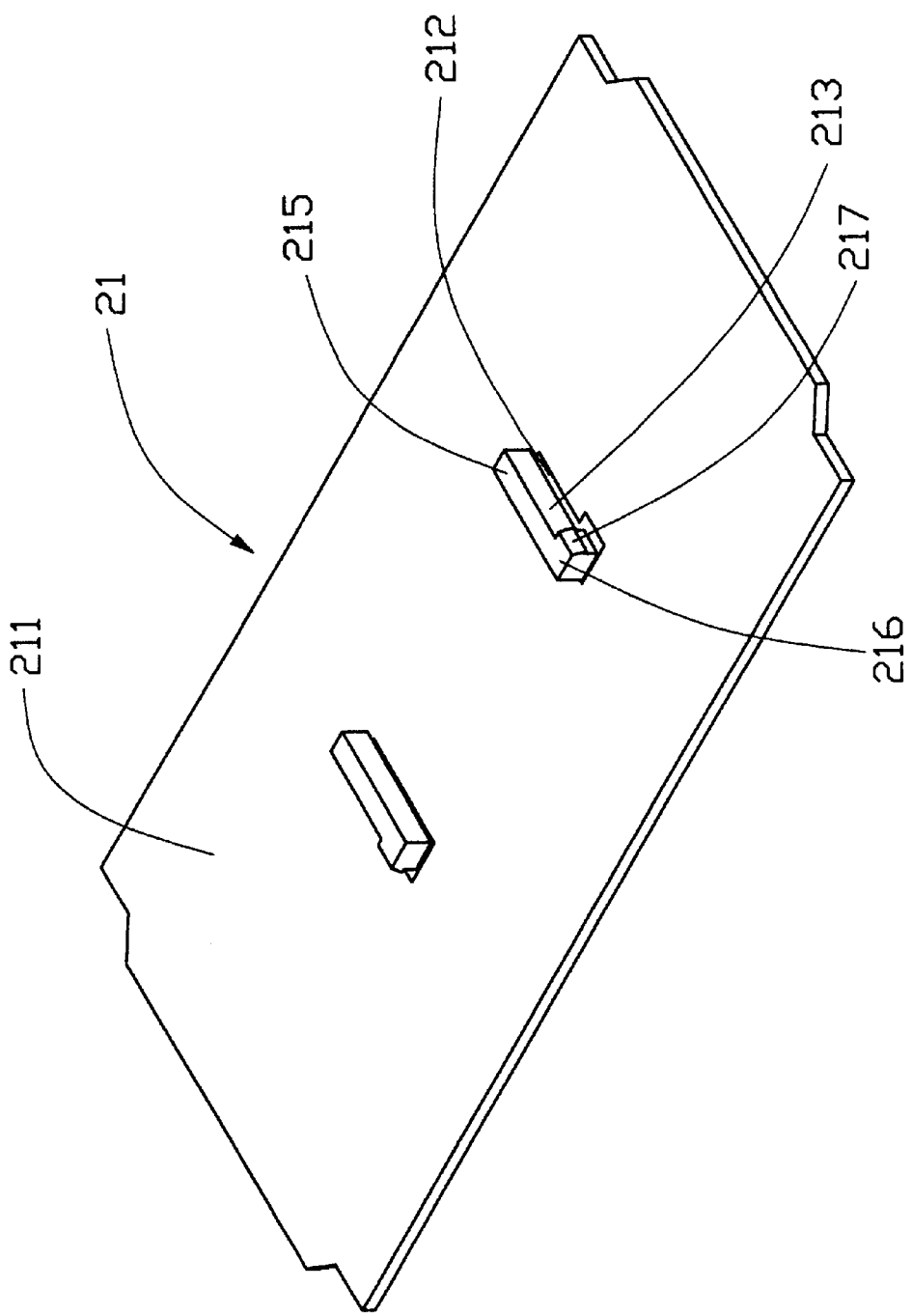
FIG. 3 is a bottom perspective view of a cap of the electrical socket assembly of FIG. 1.
Figure 4:
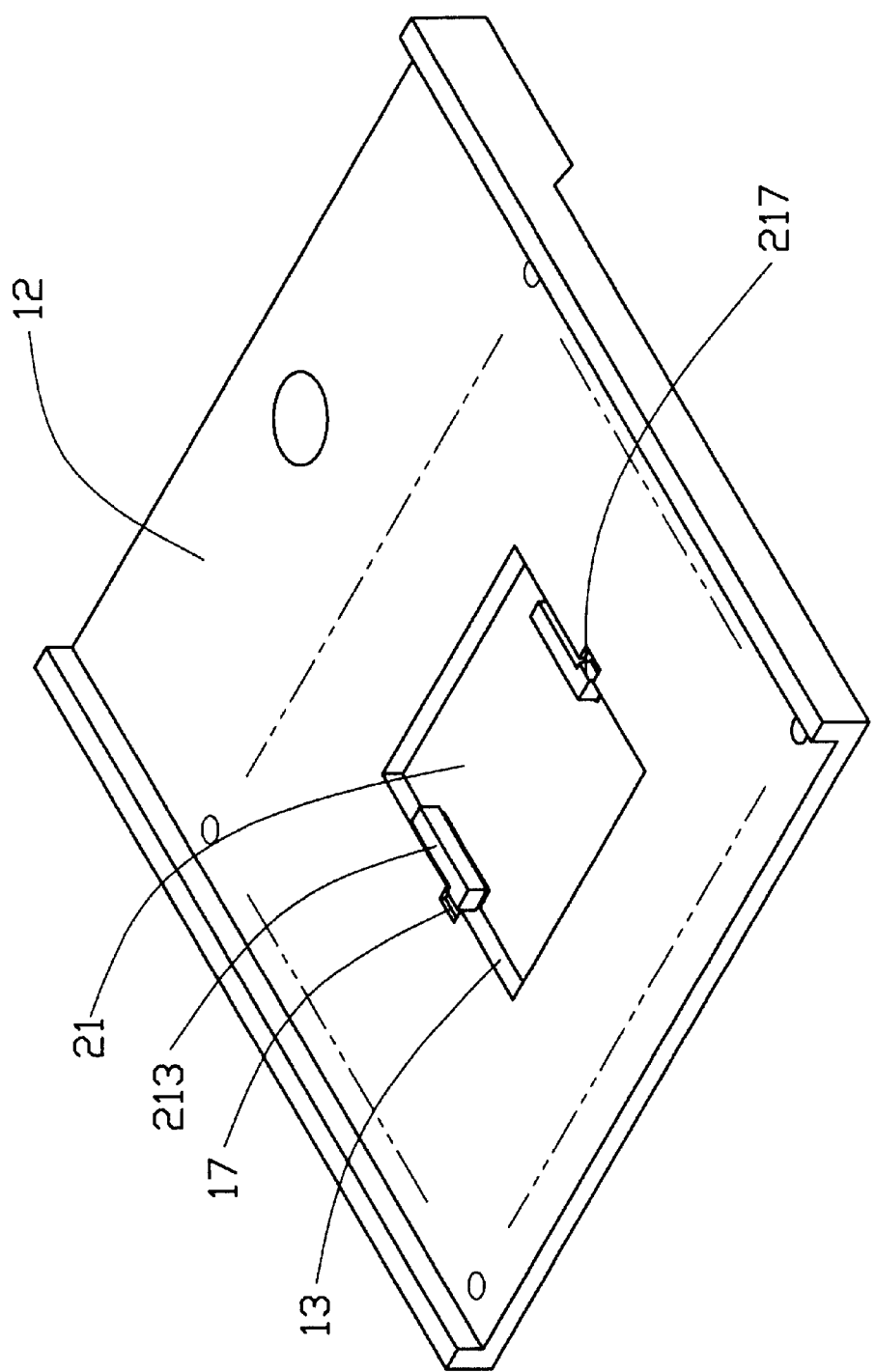
FIG. 4 is a bottom perspective view of the cap of FIG. 3 assembled with the cover of FIG. 2.
Figure 5:
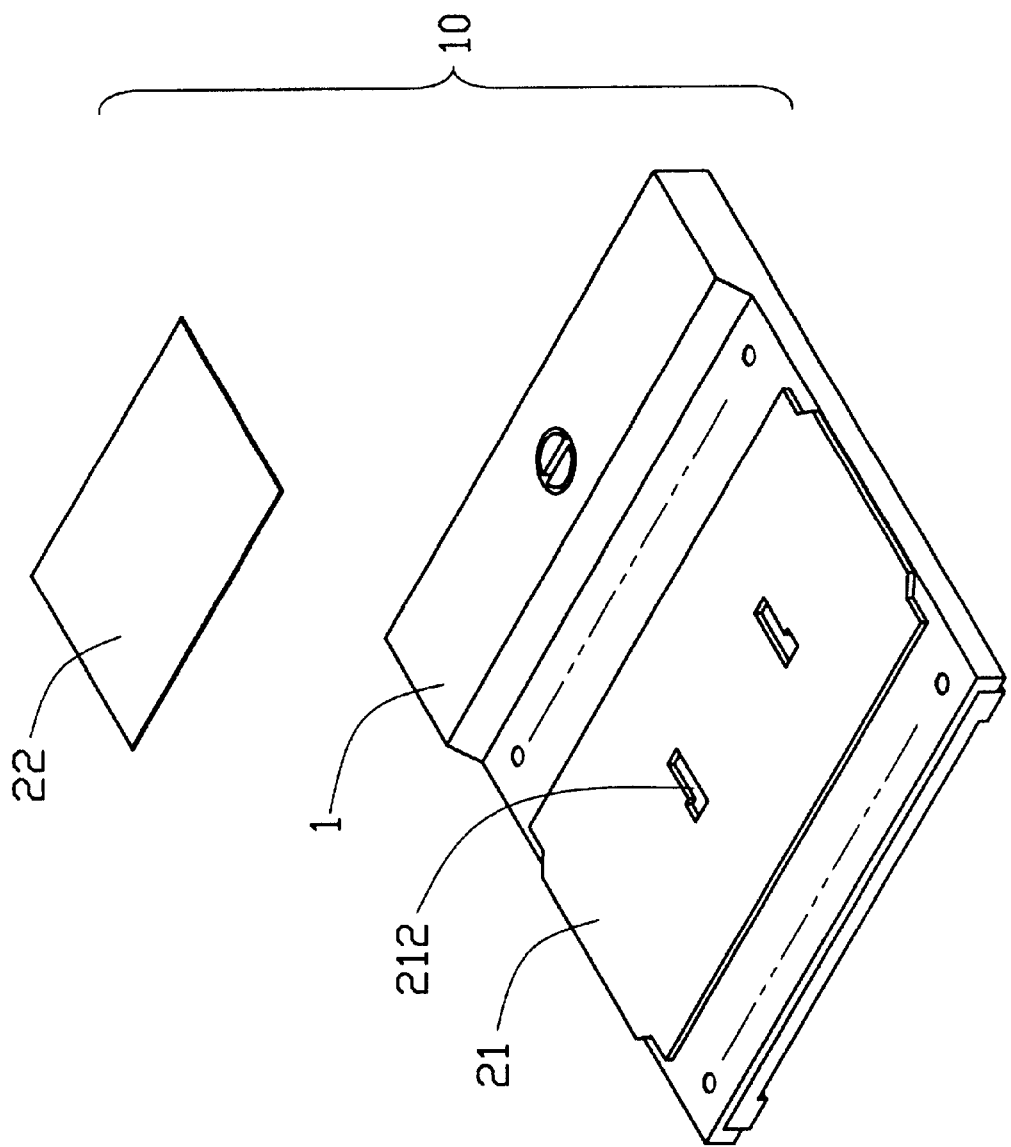
FIG. 5 is a partial assembled view of FIG. 1.

Referring to FIGS. 1 and 3, the pick up device 2 comprises a cap 21 and a film member 22 adhered to the cap 21. A pair of resilient beams 213 project from a bottom face 211 of the cap 21. One end 215 of each resilient beam 213 is fixed to the bottom face 211 while another end 216 is free and forms a latching protrusion 217 for latching into a corresponding cutout 17 of the cover 12. Additionally, the cap 21 defines a pair of through slots 212 and corresponding to the resilient beams 213, respectively, for inspection of the engagement between the resilient beams 213 and the corresponding cutouts 17 of the cover 12. Each slot 212 has a contour similar to the corresponding resilient beam 213 and forms a recessed section 214 at an end thereof.

Figure 6:
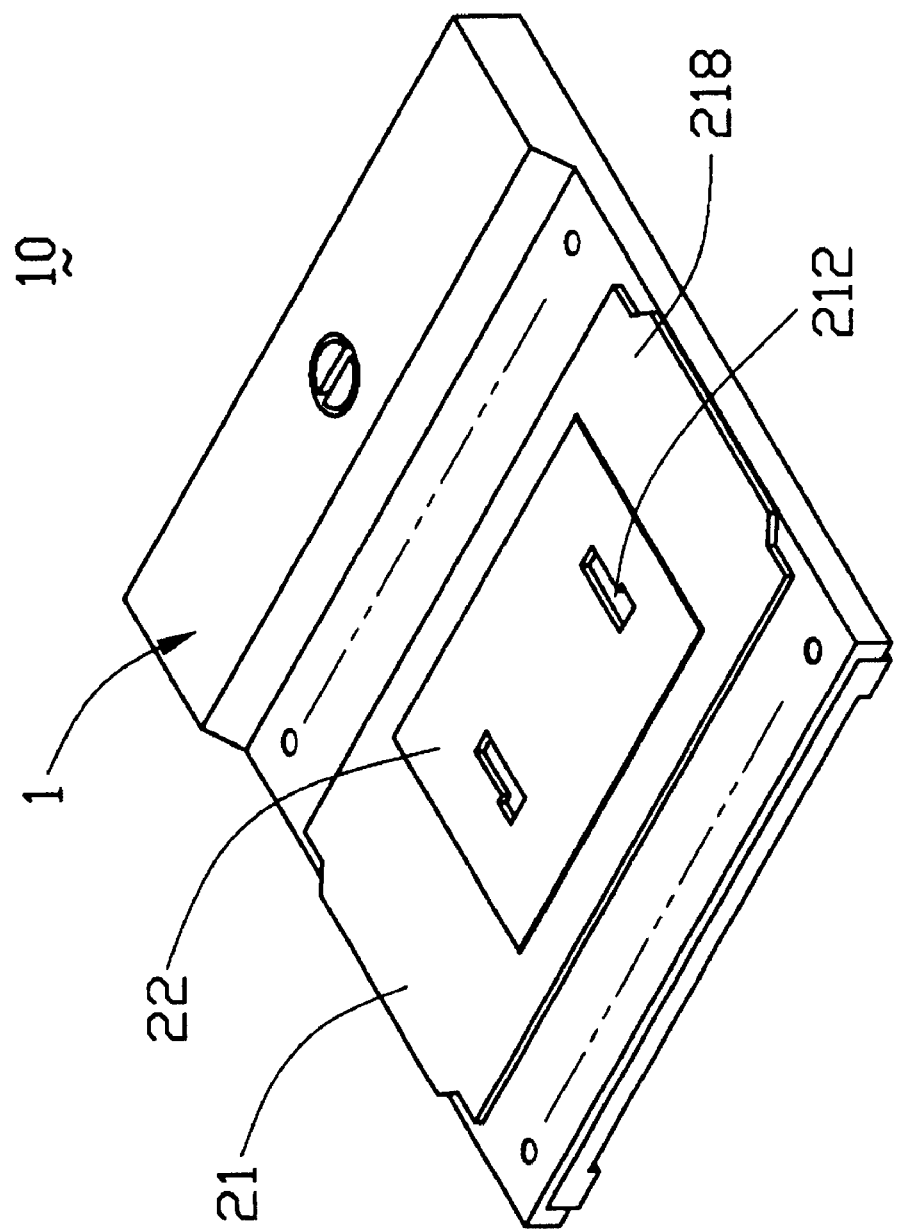
FIG. 6 is an assembled view of FIG. 1.
Figure 7:
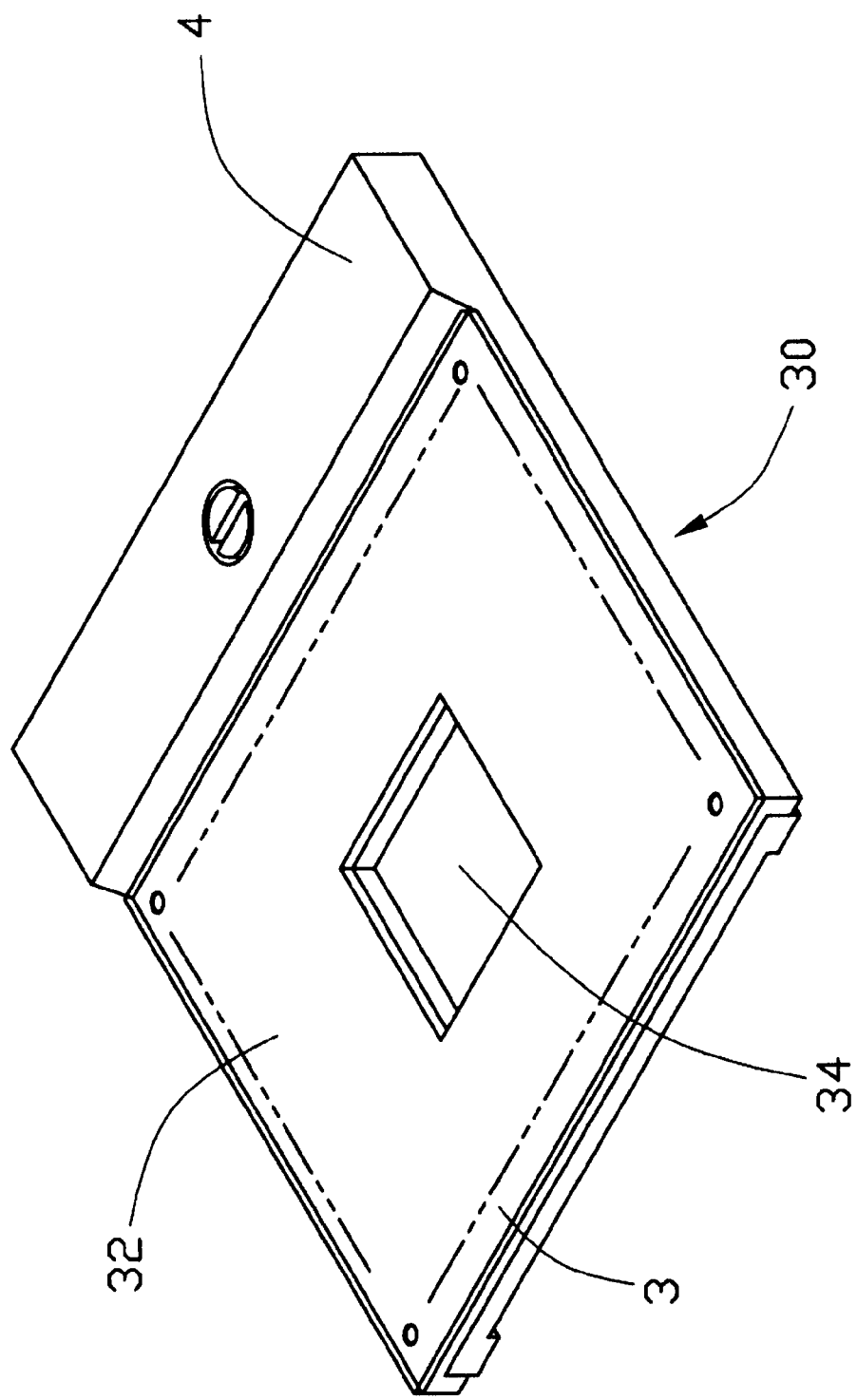
FIG. 7 is an assembled view of a conventional electrical socket assembly.
Figure 8:
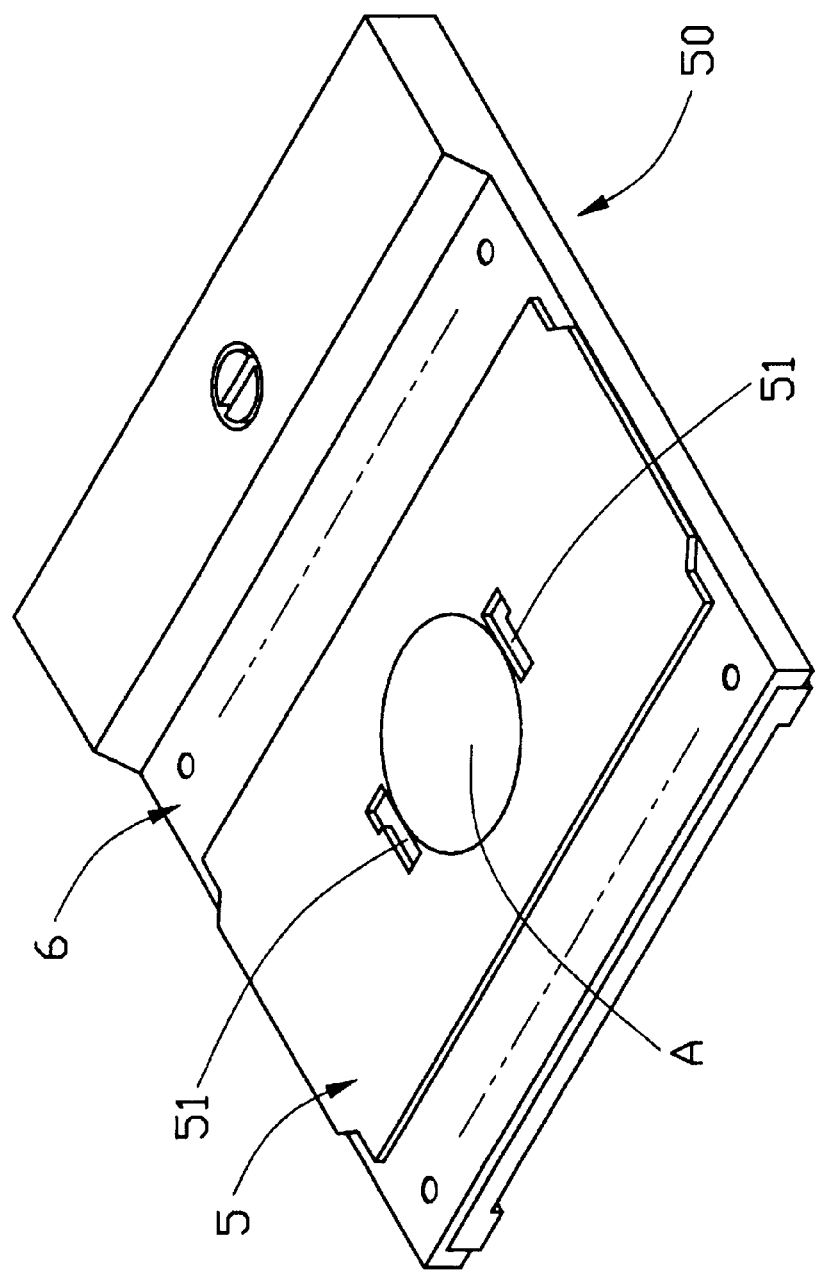
FIG. 8 is an assembled view of another conventional electrical socket assembly.

Referring to FIG. 6, the film member 22 is an airtight adhesive tape or a thin film for adhering to a top face 218 of the cap 21. The film member 22 is sized to cover the through slots 212 of the cap 21. In the preferred embodiment of the present invention, the film member 22 has a size slightly larger than that defined by the pair of through slots 212. Furthermore, the film member 22 is as thin as possible. In this way, the manufacturing cost of the film member 22 is reduced with respect to the related prior art described above, and the vacuum suction device can easily manipulate the cap 21 by means of the film member 22.

In assembly, referring to FIGS. 1, and 4 to 6, the cap 21 is mounted to the cover 12. The resilient beams 213 of the cap 21 abut against the inner side edges 13 of the cover 12, and the latching protrusions 217 engage with the corresponding cutouts 17 for securing the cap 21 to the cover 12. Then, the film member 22 is adhered to the top face 218 of the cap 21 and covers both slots 212, as shown in FIG. 6. An assembled socket assembly 10 is thus obtained, ready for being manipulated to be appropriately positioned on the circuit board by the vacuum suction device. Understandably, the film member 22 is only required to be dimensioned/configured to cover the slots instead of the whole central open 121 of the cover 12 or even the most portions of the cover 12.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly for being positioned onto a circuit board by a vacuum suction device, comprising:

a socket having a base and a cover slidably mounted on the base;

a cap mounted to the cover and defining a pair of through slots; and a thin film member attached to a top face of the cap and fully covering the through slots of tie cap to be manipulated by the vacuum suction device; wherein
the film member is an airtight tape; wherein
the film member has a size sufficient to cover said top face of said cap; wherein
the cover defines a central opening and a pair of cutouts in opposite side edges and in communication with the central opening; wherein
the cap forms in a bottom face thereof a pair of resilient beams respectively corresponding to the through slots, each resilient beam forming a latching protrusion latched into a corresponding one of the cutouts.

* * * * *